United States Patent
Furukawa et al.

(10) Patent No.: US 6,555,891 B1
(45) Date of Patent: Apr. 29, 2003

(54) SOI HYBRID STRUCTURE WITH SELECTIVE EPITAXIAL GROWTH OF SILICON

(75) Inventors: Toshiharu Furukawa, Essex Junction, VT (US); Jack A. Mandelman, Stormville, NY (US); Dan Moy, Bethel, CT (US); Byeongju Park, Wappingers Falls, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 09/690,674

(22) Filed: Oct. 17, 2000

(51) Int. Cl.[7] .............................................. H01L 29/00
(52) U.S. Cl. ...................... 257/505; 257/513; 257/514; 257/515; 257/516; 257/517; 257/520; 257/347
(58) Field of Search ......................... 257/347, 59, 330, 257/301, 351, 565, 505, 513, 514–517, 520

(56) References Cited

U.S. PATENT DOCUMENTS

| | | |
|---|---|---|
| 4,008,111 A | 2/1977 | Rutz |
| 4,571,818 A | 2/1986 | Robinson et al. |
| 4,601,779 A | 7/1986 | Abernathey et al. |
| 4,649,627 A | 3/1987 | Abernathey et al. |
| 4,893,509 A | 1/1990 | MacIver et al. |
| 4,910,165 A | 3/1990 | Lee et al. |
| 4,985,745 A | 1/1991 | Kitahara et al. |
| 5,004,705 A | 4/1991 | Blackstone |
| 5,086,011 A | 2/1992 | Shiota |
| 5,143,862 A | 9/1992 | Moslehi |
| 5,234,535 A | 8/1993 | Beyer et al. |
| 5,258,318 A | 11/1993 | Buti et al. |
| 5,294,823 A | 3/1994 | Eklund et al. |
| 5,321,298 A | 6/1994 | Moslehi |
| 5,352,912 A | 10/1994 | Crabbe et al. |
| 5,481,126 A * | 1/1996 | Subramanian et al. |
| 5,496,745 A * | 3/1996 | Ryum et al. |
| 5,516,718 A | 5/1996 | Lee |
| 5,543,653 A | 8/1996 | Grubisich |
| 5,627,092 A * | 5/1997 | Alsmeier et al. |
| 5,656,514 A | 8/1997 | Ahlgren et al. |
| 5,770,484 A * | 6/1998 | Kleinhenz |
| 5,789,793 A | 8/1998 | Kurtz et al. |
| 5,895,953 A | 4/1999 | Beasom |
| 5,956,597 A | 9/1999 | Furukawa et al. |

* cited by examiner

Primary Examiner—Fetsum Abraham
(74) Attorney, Agent, or Firm—Schmeiser, Olsen & Watts; William D. Sabo

(57) ABSTRACT

A method and structure for selectively growing epitaxial silicon in a trench formed within a silicon-on-insulator (SOI) structure. The SOI structure includes a buried oxide layer (BOX) on a bulk silicon substrate, and a silicon layer on the BOX. A pad layer is formed on the silicon layer. The pad layer includes a pad nitride (e.g., silicon nitride) on a pad oxide (e.g., silicon dioxide), and the pad oxide has been formed on the silicon layer. A trench is formed by anisotropically etching through the pad layer, the silicon layer, the BOX, and to a depth within the bulk silicon substrate. Insulative spacers are formed on sidewalls of the trench. An epitaxial silicon layer is grown in the trench from a bottom of the trench to above the pad layer. The pad layer and portions of the epitaxial layer are removed (e.g., by chemical mechanical polishing), resulting in a planarized top surface of the epitaxial layer that is about coplanar with a top surface of the silicon layer. Electronic devices may be formed within the epitaxial silicon of the trench. Such electronic devices may include dynamic random access memory (DRAM), bipolar transistors, Complementary Metal Oxide Semiconductor (CMOS) circuits which are sensitive to floating body effects, and devices requiring threshold voltage matching. Semiconductor devices (e.g., field effect transistors) may be coupled to the SOI structure outside the trench.

13 Claims, 12 Drawing Sheets

SOI HYBRID STRUCTURE WITH SELECTIVE EPITAXIAL GROWTH OF SILICON

BACKGROUND OF THE INVENTION

1. Technical Field

The present invention relates to a method and structure for selectively growing epitaxial silicon in a trench formed within a silicon-on-insulator (SOI) structure.

2. Related Art

A Dynamic Random Access Memory (DRAM) cell coupled to a silicon-on-insulator (SOI) structure is characterized by a significant degradation of DRAM capacitor charge retention time as compared with a DRAM cell on a bulk silicon substrate. A method and structure is needed for coupling a DRAM cell to a SOI substrate without having the significant degradation of the DRAM capacitor charge retention time.

Bipolar junction and Complementary Metal Oxide Silicon (BiCMOS) devices have bipolar transistors typically located more than 200 nm into the depth of the structure of the BiCMOS device which is deeper than the buried oxide layer of a typical SOI substrate. As a result, an integration of SOI Complementary Metal Oxide Semiconductor (CMOS) devices and bipolar transistors of BiCMOS devices is problematic. A method and structure is needed for integrating SOI CMOS devices and bipolar transistors of BiCMOS devices.

SUMMARY OF THE INVENTION

The present invention provides a method for forming an electronic structure, comprising the steps of:

forming a silicon-on-insulator (SOI) structure having a buried oxide layer (BOX) on a bulk silicon substrate, and a silicon layer on the BOX;

anisotropically etching the SOI structure to form a trench through the silicon layer, through the BOX, and through a depth D of the silicon substrate, wherein $D \geq 0$;

forming insulative spacers on sidewalls of the trench; and growing an epitaxial layer of silicon or silicon-germanium alloy in the trench from a bottom of the trench to a height at or above the silicon layer, wherein the insulative spacers provide electrical insulation between the silicon layer outside the trench and the epitaxial layer.

The present invention provides an electronic structure, comprising:

a silicon-on-insulator (SOI) structure having a buried oxide layer (BOX) on a bulk silicon substrate, and a silicon layer on the BOX;

a trench through the silicon layer, through the BOX, and through a depth D of the silicon substrate, wherein $D \geq 0$;

insulative spacers on sidewalls of the trench; and an epitaxial layer of silicon or silicon-germanium alloy in the trench from a bottom of the trench to a height at or above a top surface of the silicon layer, wherein the insulative spacers provide electrical insulation between the silicon layer outside the trench and the epitaxial layer.

The present invention provides a method and structure for having an epitaxial silicon layer in a trench that is within a SOI layer, wherein the epitaxial layer includes one or more electronic devices, and wherein the SOI layer outside the trench includes one or more electronic devices.

The present invention provides a method and structure for coupling a DRAM cell or a bipolar device to a SOI layer without having a significant degradation of the DRAM capacitor charge retention time.

DETAILED DESCRIPTION OF THE INVENTION

Figure 1:
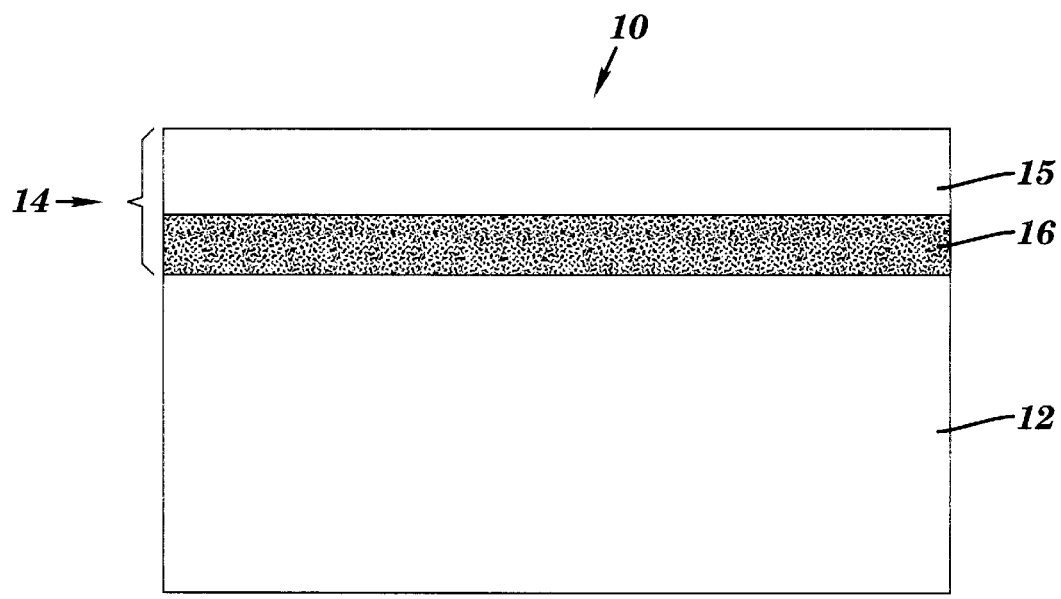
FIG. 1 depicts a front-cross sectional view of an electronic structure having a silicon-on-insulator (SOI) layer on a bulk semiconductor substrate, in accordance with embodiments of the present invention.

FIG. 1 illustrates a front-cross sectional view of an electronic structure 10 having a silicon-on-insulator (SOI)

structure of a SOI layer 14 on a bulk semiconductor substrate 12, in accordance with embodiments of the present invention. The bulk semiconductor substrate 12 includes a semiconductor material such as, inter alia, a P⁻ type doped single crystalline silicon. The SOI layer 14 includes a silicon layer 15 on a buried oxide layer (BOX) 16. The BOX 16, which includes an oxide such as silicon dioxide, is on the bulk semiconductor substrate 12. The BOX 16 may have a thickness of, inter alia, from about 10 nanometers (nm) to about 200 nm. The silicon layer 15 may have a thickness of, inter alia, from about 10 nanometers (nm) to about 200 nm.

The SOI layer 14 may be formed by any method known to one of ordinary skill in the art, such as a Separation by IMplantation of OXygen (SIMOX) method or a bonded silicon method. With the SIMOX method, oxygen is implanted into the bulk semiconductor substrate 12, followed by reacting under elevated temperature the implanted oxygen with material of the bulk semiconductor substrate 12 to form the oxide of the BOX 16 (e.g., to form silicon dioxide of the BOX 16 if the bulk semiconductor substrate includes silicon). An unreacted portion of the bulk semiconductor 12 remains above the BOX 16 and thus becomes the silicon layer 15. The bonded silicon method grows a thermal oxide on a top portion of the bulk semiconductor substrate 12, followed by bonding a thin silicon surface wafer to the BOX 16 such that the thin silicon surface wafer becomes the silicon layer 15.

Figure 2:
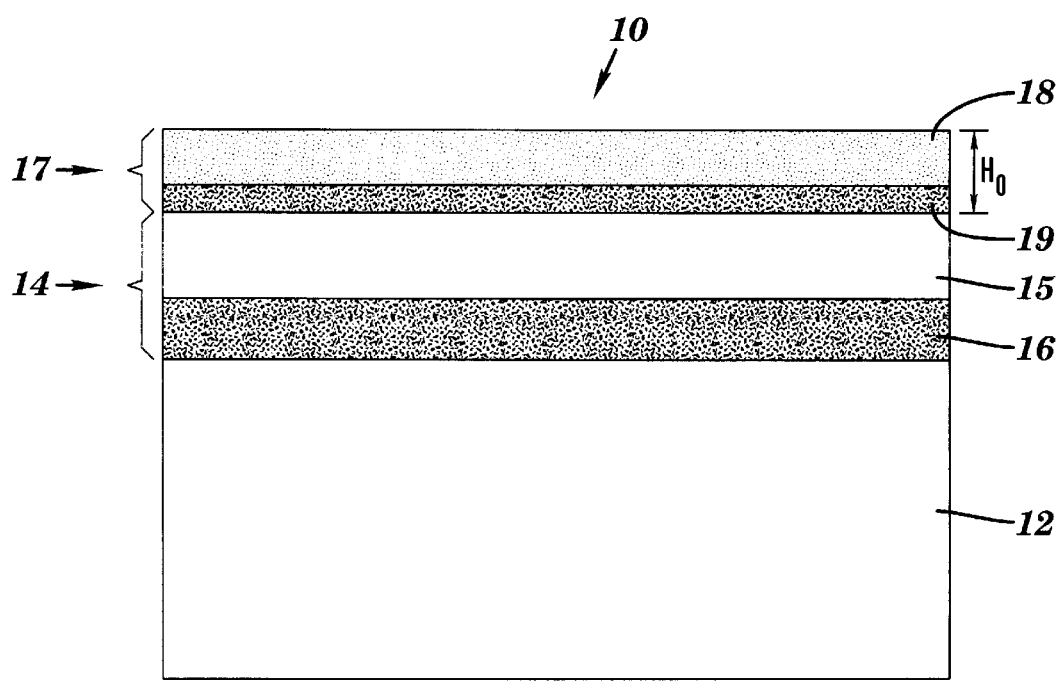
FIG. 2 depicts FIG. 1 after a pad layer is formed on the SOI layer.

FIG. 2 illustrates FIG. 1 after a pad layer 17 is formed on the SOI layer 14. The pad layer 17 includes a pad nitride 18 on a pad oxide 19. The pad oxide 19 includes an oxide such as silicon dioxide, and may have a thickness of, inter alia, from about 2 nanometers (nm) to about 10 nm. The pad nitride 18 includes a nitride such as silicon nitride, and may have a thickness of, inter alia, from about 10 nanometers (nm) to about 500 nm. Thus, the pad layer 17 has a thickness $H_0$ of, inter alia, about 12 nm to about 510 nm. The pad layer 17 is interfaced with the SOI layer 14 by having the pad oxide 19 on the silicon layer 15. The pad nitride 18 serves as a barrier to protect the silicon layer 15 from being penetrated by chemical etchant during subsequent epitaxial silicon deposition processing, or by a polishing agent during subsequent chemical mechanical planarization processing. Also, the pad nitride 18 is used to prevent oxidation of material of the silicon layer 15 during the planarization oxidation step discussed infra in conjunction with FIG. 7. The pad oxide 19 serves to protect the silicon layer 15 during a subsequent stripping of the pad layer 17.

Figure 3:
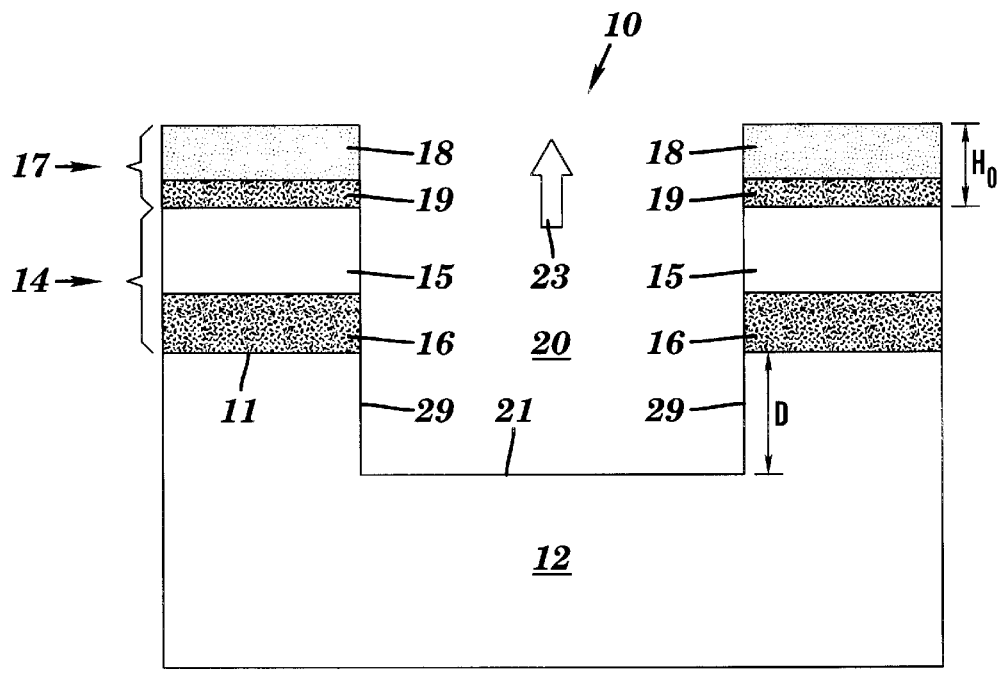
FIG. 3 depicts FIG. 2 after a trench has been formed through the pad layer, through the SOI layer, and through a portion of the bulk semiconductor substrate.

FIG. 3 illustrates FIG. 2 after a trench 20 with approximately vertical sidewalls has been formed through the pad layer 17, through the SOI layer 14, and through a depth D ($D \geq 0$) of the bulk semiconductor substrate 12. The depth D is application dependent. If D=0, then a bottom surface 21 of the trench 20 is about coplanar with a bottom surface 11 of the BOX 16. Inasmuch as electronic devices will be subsequently formed in the trench 20, a width of the trench (in a direction normal to the direction 23) depends on the number of such devices that will be formed in the trench 20. Since the number of such electronic devices could be as few as one or as many as thousands or more, the width of the trench could be as small as an order of microns or as large as millimeters.

The trench 20 may be formed by any method known to one of ordinary skill in the art. For example, a layer of photoresist may be patterned on the pad nitride layer 18 of FIG. 2 in a manner that defines where the trench 20 is to be formed, followed by: exposing the photoresist to ultraviolet radiation, dissolving away the photoresist where the trench 20 is to be formed, and forming the trench 20 with approximately vertical sidewalls by reactive ion etching (RIE). A shape of a cross section of the trench 20 (i.e., a cross section normal to a direction 23) may have a rectangular shape or any other geometrical shape. After the trench 20 is formed, the photoresist is removed.

Figure 4:
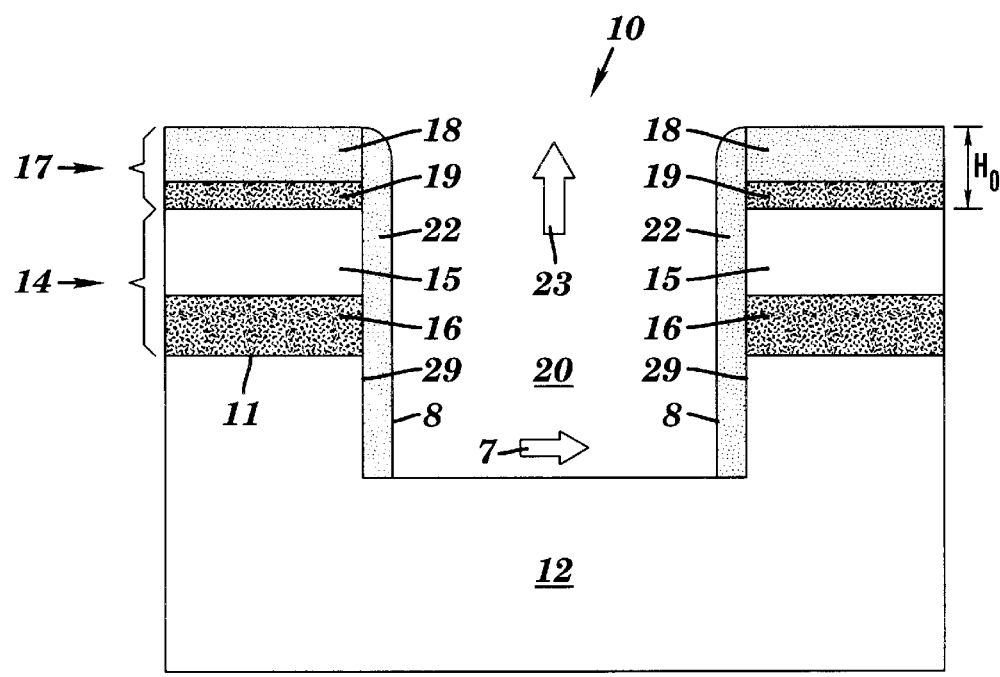
FIG. 4 depicts FIG. 3 after an insulative spacer has been formed on the trench sidewalls.

FIG. 4 illustrates FIG. 3 after a spacer 22 has been deposited on the trench sidewalls 29 by any method known to one of ordinary skill in the art. The spacer 22 is an insulative film of thickness in a direction 7 from, inter alia, about 10 nm to about 100 nm. The insulative film of the spacer 22 may include, inter alia, a film of oxide such as silicon dioxide, a film of nitride such as silicon nitride, or a film of nitride over a film of oxide analogous to the pad layer 17. The spacer 22 prevents a subsequently formed epitaxial silicon growth in the trench 20 (as will be discussed infra in conjunction with FIG. 5) from depositing on the sidewalls 29 of the trench 20, which promotes said epitaxial silicon growth as a single crystalline silicon layer without grain boundaries. The spacer 22 also provides electrically insulative separation between the subsequently formed epitaxial silicon growth in the trench 20 and the silicon layer 15. Thus, the spacer 22 will provide electrically insulative separation between the subsequently formed epitaxial silicon growth in the trench 20 and electronic devices (e.g., transistors) subsequently formed in, or subsequently coupled to, the silicon layer 15 outside the trench 20. Walls 8 of the spacer 22 have been formed as approximately vertical (i.e., in the direction 23) by a directional etching such as RIE. The spacer 22, together with the pad nitride 18, prevents oxidation of the silicon layer 15 during the planarization oxidation described infra in conjunction with FIG. 7.

Figure 5:
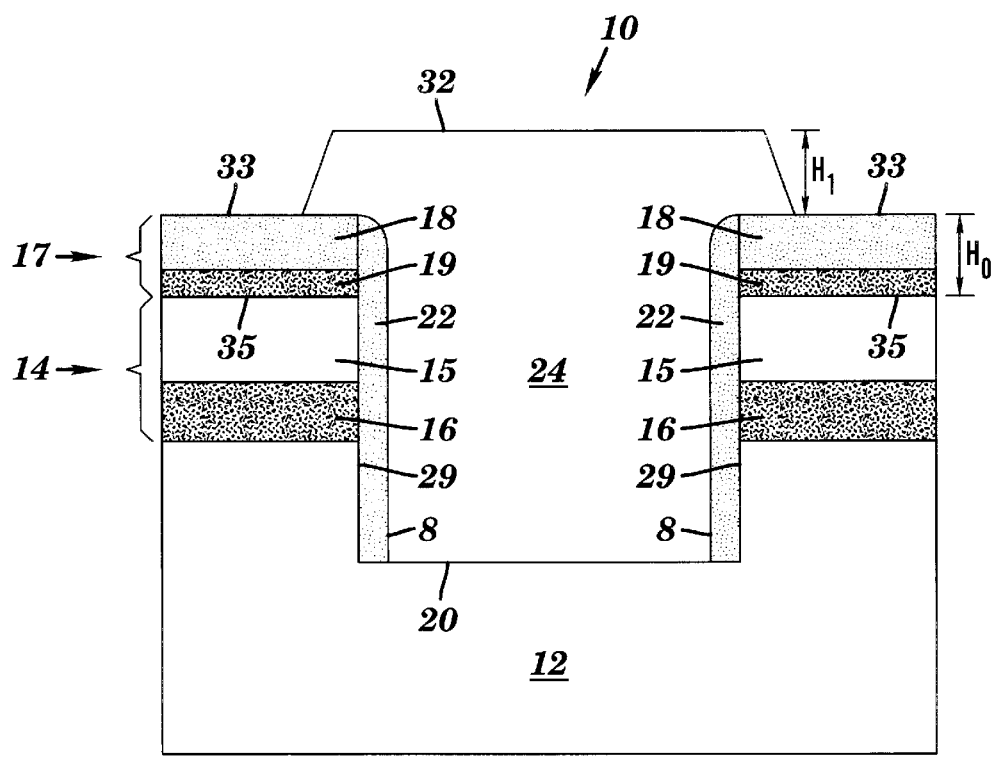
FIG. 5 depicts FIG. 4 after an epitaxial layer of single crystalline silicon or single crystalline silicon-germanium alloy has been grown or overgrown in the trench.

FIG. 5 illustrates FIG. 4 after an epitaxial layer 24 of single crystalline silicon has been grown or overgrown in the trench 20. The epitaxial layer 24 has been overgrown by a overgrowth $H_1$, wherein $H_1 \geq 0$. $H_1 = 0$ corresponds to a case of no overgrowth of the epitaxial layer 24. As stated supra, the spacer 22 promotes formation of the single crystalline silicon layer 24 without grain boundaries.

The epitaxial layer 24 of single crystalline silicon may be grown by selective epitaxial silicon deposition processing as is known to one of ordinary skill in the art. For example, the epitaxial layer 24 may be formed by flowing a reactant gas (e.g., dichlorosilane $SiH_2Cl_2$, trichlorosilane $SiHCl_3$, silicontetrachloride $SiCl_4$, or silane $SiH_4$) in the trench 20, together with a carrier gas (e.g., hydrogen) to make the reactant gas flow approximately uniformly, and an etchant gas (e.g., HCl) to prevent polysilicon growth along the vertical walls 8 of the spacer 22 and on the top surface 33 of the pad nitride 18. An elevated process temperature is used to grow the epitaxial layer 24 with the reactant gas. The reactant gas sets the process temperature as is known by persons of ordinary skill in the art. Generally, the process temperature increases with increasing number of chlorine atoms in the reactant gas molecule.

Alternatively, if desired, single crystalline silicon-germanium alloy may be grown, instead of single crystalline silicon, in the trench 20 by adding a source gas for germanium (e.g., germane $GeH_4$) in the selective silicon-germanium alloy epitaxial deposition process as is well known to one of ordinary skill in the art. Thus, all discussion supra or infra herein relating to single crystalline silicon in the trench 20 also applies to silicon-germanium alloy in the trench 20.

Figure 6:
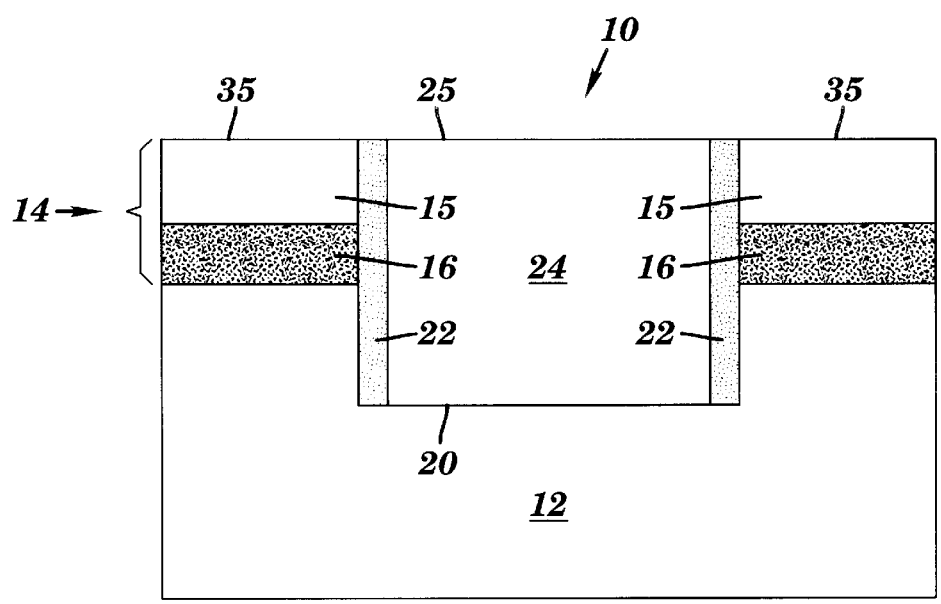
FIG. 6 depicts FIG. 5 after portions of the epitaxial layer and the pad layer have been removed, resulting in a top surface of the epitaxial layer that is about coplanar with a top surface of the SOI layer.

FIG. 6 illustrates FIG. 5 after portions of the epitaxial layer 24, and the pad layer 17, have been removed, resulting in a top surface 25 of the epitaxial layer 24 that is about coplanar with a top surface 35 of the silicon layer 15 of the SOI layer 14. Said removal may be accomplished by any method known to a person of ordinary skill in the art, such as by chemical mechanical polishing (CMP).

The planarized epitaxial layer 24 in FIG. 6 is a medium in which electronic devices (e.g., DRAM cells) may be formed as will be described infra. The following discussion of FIGS. 7–10 describes alternatives to the aforementioned method steps (culminating in FIG. 6) for forming the planarized epitaxial layer 24.

Figure 7:
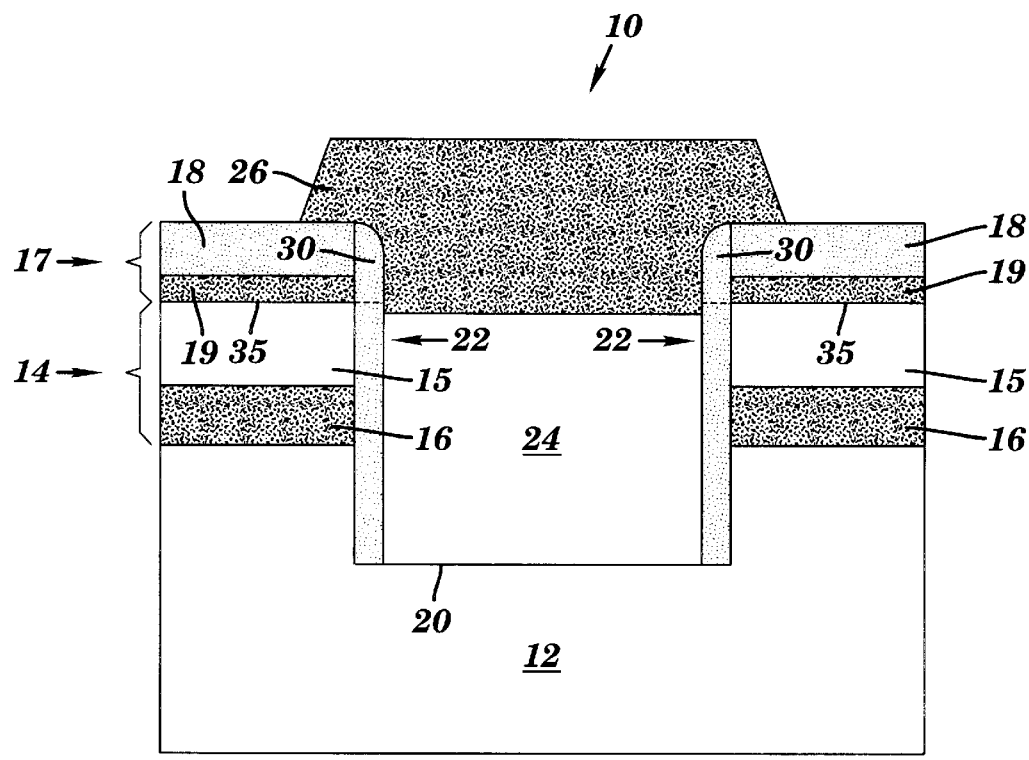
FIG. 7 depicts FIG. 5 following thermal oxidation of a top portion of the epitaxial layer to a level of a top surface of the SOI layer.

FIG. 7 illustrates a first alternative to forming the planarized epitaxial layer 24 by the aforementioned method culminating in FIG. 6. FIG. 7 illustrates FIG. 5 following thermal oxidation of a top portion 26 of the epitaxial layer 24 to a level of the top surface 35 of the silicon layer 15 of the SOI layer 14. The spacer 22 and the pad nitride 18 prevent oxidation of the silicon layer 15. Then the thermally oxidized top portion 26 is removed by wet etch or similar methods. Next, the pad layer 17 and a top portion 30 of the spacer 22 (i.e., the portion of the spacer 22 which is in contact with the thermally oxidized top portion 26) are removed. The thermally oxidized top portion 26 may be removed by any method known to one of ordinary skill in the art, such as, inter alia, a wet etching with hydrofluoric acid. The pad layer 17 and the top portion 30 of the spacer 22 may be removed by any method known to one of ordinary skill in the art. For example, the pad nitride 18 of the pad layer 17 may be removed by, inter alia, a wet etching with hot phosphoric acid as is known by one of ordinary skill in the art, and the pad oxide 19 of the pad layer 17 may be removed by, inter alia, a wet etching with hydrofluoric acid as is known by one of ordinary skill in the art. Alternatively, the aforementioned order of removal may be reversed such that the pad layer 17 and the top portion 30 of the spacer 22 are removed prior to removal of the thermally oxidized top portion 26 and the top portion 30 of the s pacer 22. After removal of the thermally oxidized top portion 26, the top portion 30 of the spacer 22, and the pad layer 17, a touch-up CMP may be utilized to sufficiently planarize the epitaxial layer 24. The resultant electronic structure 10 will appear as shown in FIG. 6.

Figure 8:
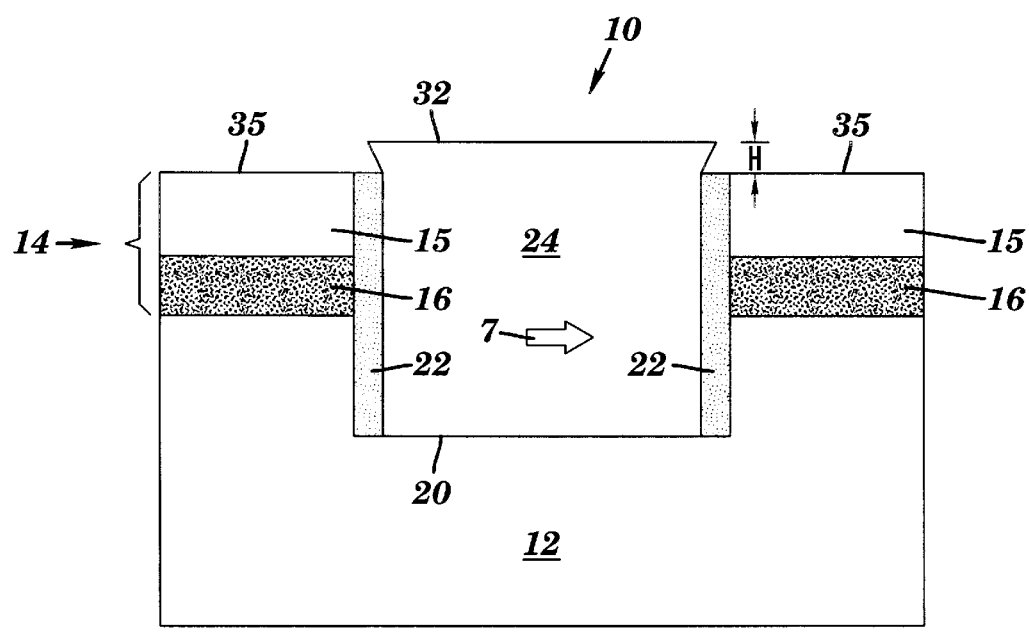
FIG. 8 depicts FIG. 5 after the pad layer has been removed.

FIG. 8 illustrates a second alternative to forming the planarized epitaxial layer 24 by the aforementioned method culminating in FIG. 6. FIG. 8 is relevant if the thickness $H_0$ (see FIG. 5 for an illustration of $H_0$) of the pad layer 17 is small (i.e., if $H_0$ less than about 20 nm). FIG. 8 illustrates FIG. 5 after the pad layer 17 has been removed by any method known to one of ordinary skill in the art, such as any method described supra in conjunction with FIG. 7. A height of the epitaxial layer 24 in left essentially intact. Accordingly, a top surface 32 of the epitaxial layer 24 is at a height H, wherein $H \geq 0$, above the top surface 35 of the silicon layer 15. In particular, H is about equal to $H_0 + H_1$ (see FIG. 5 for illustrations of $H_0$ and $H_1$). Note that a magnitude of H shown in FIG. 8 reflects a change in scale (.e., a reduction in magnitude) in $H_0$ and $H_1$ relative to the magnitude of $H_0$ and $H_1$ shown in FIG. 5, in order to emphasize that FIG. 8 is most relevant when H is small. If the top surface 32 of the epitaxial layer 24 is not sufficiently planar, then a touch-up CMP could planarize the top surface 32. Thus in contrast with FIG. 6, the electronic structure of FIG. 8 avoids processing steps relating to trimming the epitaxial layer 24 down to the level of the top surface 35 of the silicon layer 15.

Figure 9:
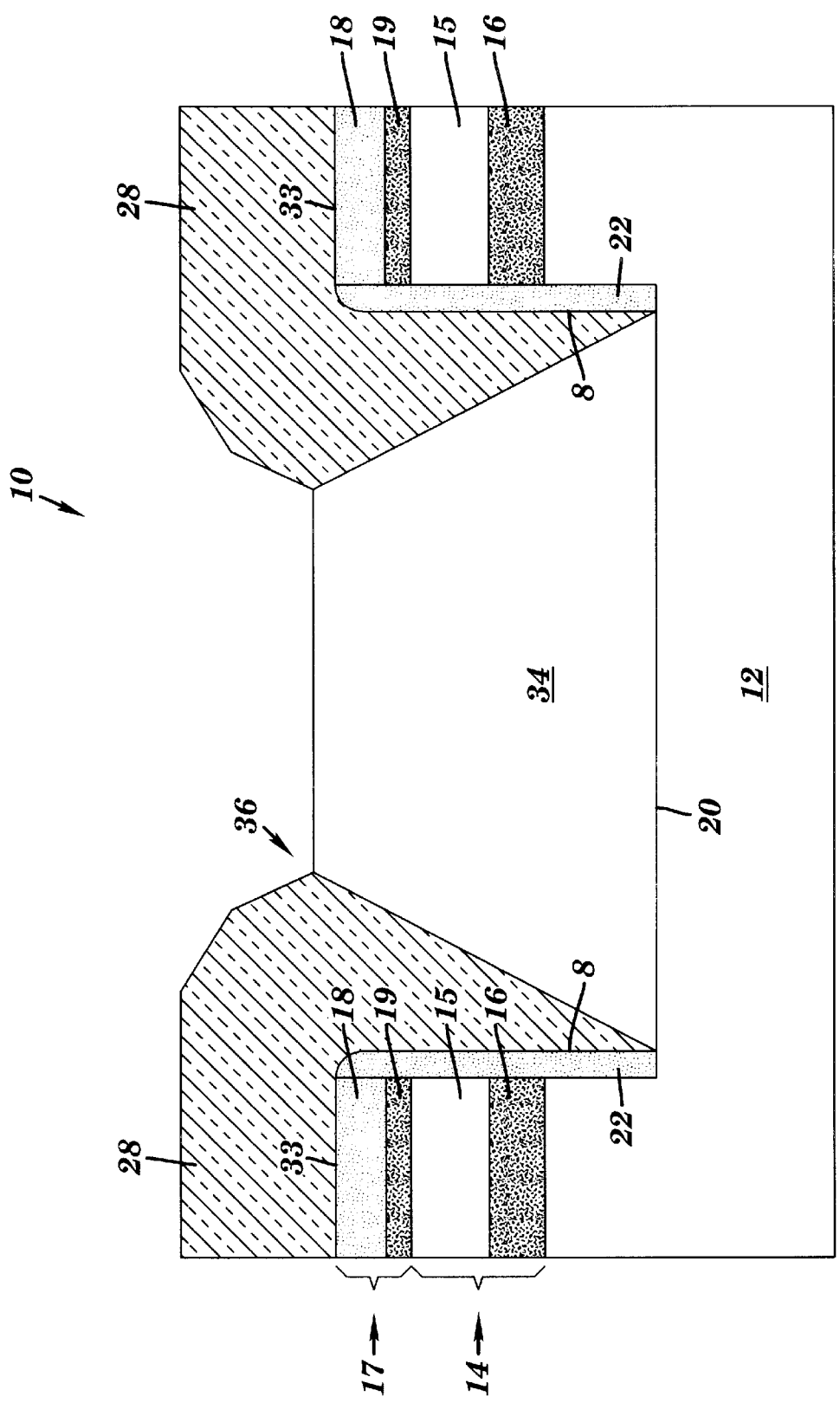
FIG. 9 depicts FIG. 4 after an overgrown epitaxial layer of silicon has been formed in the trench, with polycrystalline silicon along the trench sidewalls and single crystalline silicon in a central portion of the trench.
Figure 10:
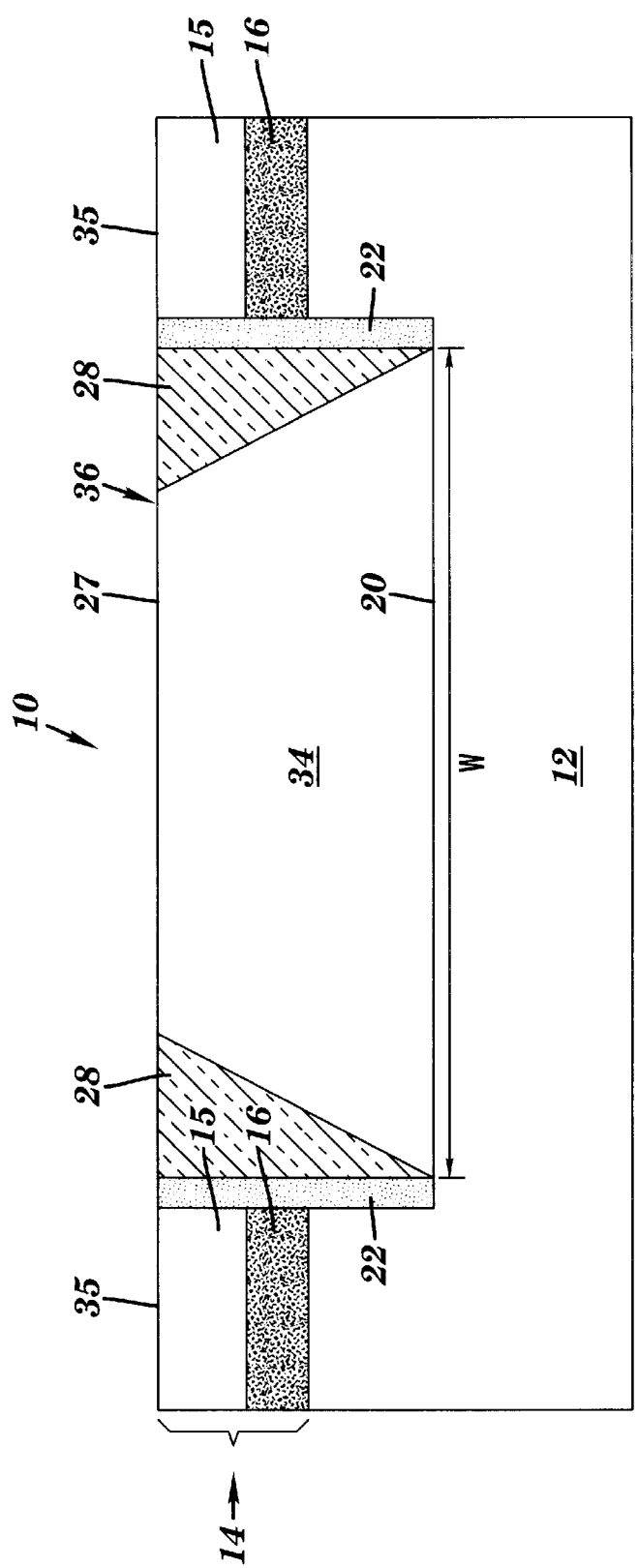
FIG. 10 depicts FIG. 9 after portions of the epitaxial layer and the pad layer have been removed, resulting in a top surface of the epitaxial layer that is about coplanar with a top surface of the SOI layer.

FIGS. 9–10 illustrates a third alternative to forming the planarized epitaxial layer 24 by the aforementioned method culminating in FIG. 6. FIG. 9 illustrates FIG. 4 after a silicon region 36 of overgrown silicon has been grown in the trench 20 using a blanket epitaxial silicon deposition process. The silicon region 36 includes a polycrystalline silicon growth 28 and a single crystalline silicon layer 34. The polycrystalline silicon growth 28 is along the sidewalls 8 of the spacer 22 and on the top surface 33 of the pad nitride 18. The single crystalline silicon layer 34 is within a central portion of the trench 20. The silicon region 36 may be formed (i.e., grown) by any method known to one of ordinary skill in the art. For example, the silicon region 36 may be grown by flowing a reactant gas (e.g., dichlorosilane $SiH_2Cl_2$, trichlorosilane $SiHCl_3$, silicontetrachloride $SiCl_4$, or silane $SiH_4$) in the trench 20, together with a carrier gas (e.g., hydrogen) to make the reactant gas flow approximately uniformly. In contrast with the selective epitaxial silicon deposition process described supra in conjunction with FIG. 5, there is no etchant gas (e.g., HCl) present in the blanket epitaxial silicon deposition process, and such absence of an etchant gas promotes the polysilicon growth 28 along the sidewalls 8 of the spacer 22 and on the top surface 33 of the pad nitride 18. Note that the aforementioned process associated with FIG. 9 is simpler, and thus less costly, than the comparable process associated with FIG. 5, because of the absence of the etchant gas in the process of FIG. 9 and the presence of the etchant gas in the process of FIG. 5.

Alternatively, if desired, single crystalline and polycrystalline silicon-germanium alloy may be grown, instead of single crystalline and polycrystalline silicon, in the trench 20 by adding a source gas for germanium (e.g., germane $GeH_4$) in the blanket silicon-germanium epitaxial deposition process as is well known to one of ordinary skill in the art.

FIG. 10 illustrates FIG. 9 after a planarization has removed portions of the polycrystalline silicon growth 28, the single crystalline silicon layer 34, and the pad layer 17, such that a resultant top surface 27 of the silicon region 36 is about coplanar with the top surface 35 of silicon layer 15. Such planarization may be accomplished by any of the methods discussed supra in conjunction with FIG. 6 or FIG. 7. Since semiconductor devices will be subsequently formed within the single crystalline silicon layer 34 and not within the polycrystalline silicon growth 28, the polycrystalline silicon growth 28 reduces available space for such semiconductor devices. Any such loss of available space due to the polycrystalline silicon growth 28 is tolerable or negligible, however, if the trench 20 is sufficiently wide. Inasmuch as the polycrystalline silicon growth 28 may be limited to within 2 microns, the polycrystalline silicon growth 28 will thus have a tolerable or negligible effect on space for forming such semiconductor devices if a width W of the trench 20 is at least about 5 microns.

Figure 11:
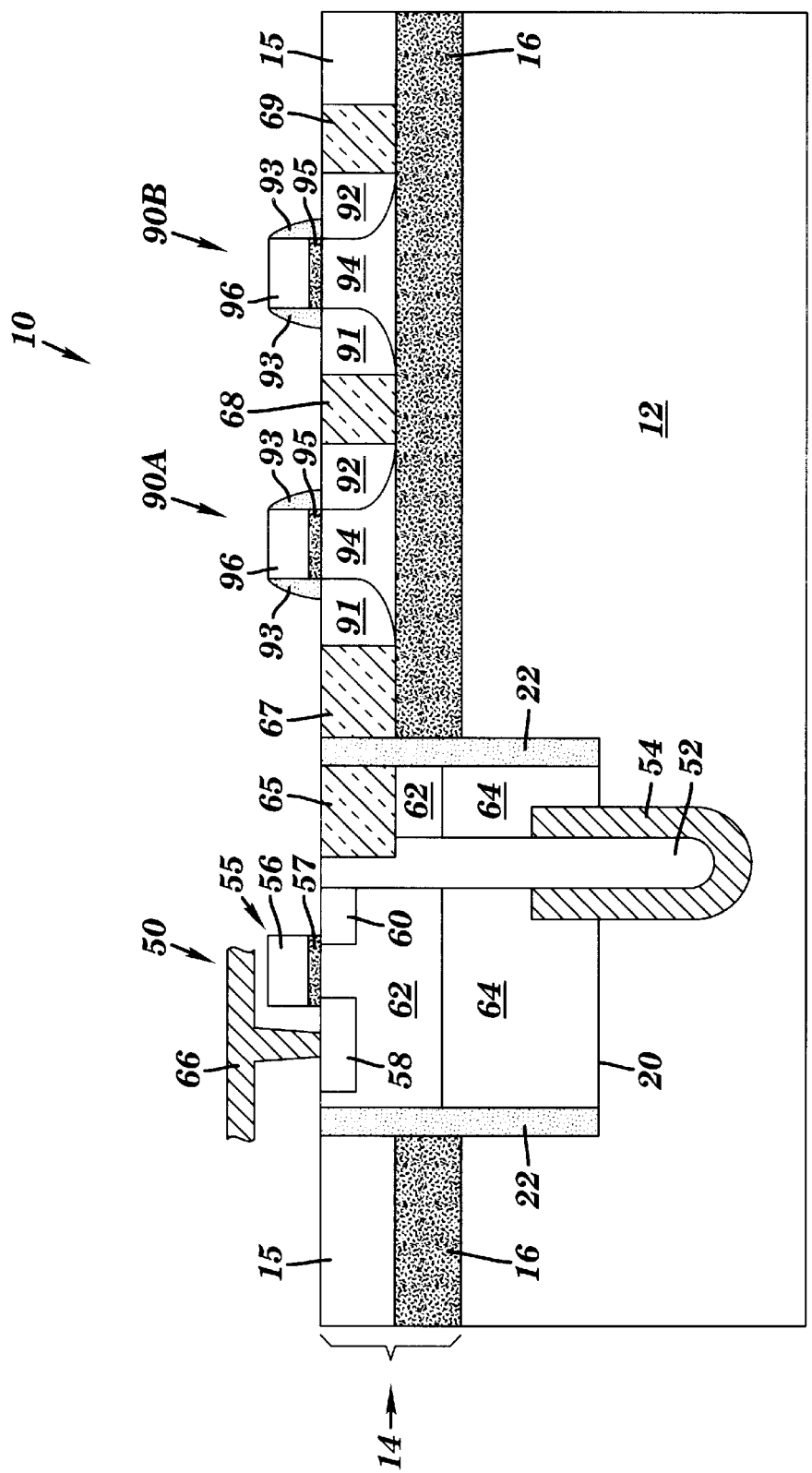
FIG. 11 depicts a Dynamic Random Access Memory (DRAM) cell formed in the epitaxial layer of FIG. 6 or FIG. 8, or in the epitaxial layer of FIG. 10, and field effect transistors formed in the SOI layer outside the trench.

FIG. 10 illustrates a Dynamic Random Access Memory (DRAM) cell 50 formed in the trench 20 (i.e., in the epitaxial layer 24 of FIG. 6 or FIG. 8, or the epitaxial layer 34 of FIG. 10), and field effect transistors 90A and 90B formed in the SOI layer 14 outside the trench 20. The DRAM cell 50 includes a storage capacitor 52 in conductive contact with a buried plate 54, a field effect transistor (FET) 55, a P-well 62, and a N-well 64, and a bit line 66. The FET 55 includes a source/drain 58, a drain/source 60, a gate conductor 56, and a gate insulator 57. The gate conductor 56 serves as a word line of the DRAM cell 50. The DRAM cell 50 is an representative example. Any DRAM cell configuration known to one of ordinary skill in the art may be formed in the trench 20 and is thus within the scope of the present invention. While FIG. 11 shows one DRAM cell in the trench 20, any number of insulatively separated DRAM cells may be formed in the trench 20. Insulative separation between successive DRAM cells in the trench 20 may be accomplished by any method known to one of ordinary skill in the art such as by use of shallow trench insolation (STI) structures.

FIG. 11 shows the FET 90A and the FET 90B in the silicon layer 15 of the SOI layer 14 outside the trench 20. The FET 90A and the FET 90B each have a source/drain 91, a drain/source 92, a channel 94, a gate conductor 96, a gate insulator 95, and insulative spacers 93. The FET 90A and the FET 90B are representative of electronic devices which may be formed in, or coupled to, the silicon layer 15 outside the trench 20. The FET 90A may be a NFET and the FET 90B may be a PFET, or vice versa, to form a Complementary Metal Oxide Semiconductor (CMOS). Generally, any type of electronic devices (e.g., semiconductor devices) may be formed in, or coupled to, the silicon layer 15 outside the trench 20. FIG. 11 exemplifies electronic devices (e.g., the DRAM cell 50) in a non-SOI epitaxial silicon enclosure (e.g., epitaxial silicon in the trench 20) coexisting with electronic devices such as DRAM support circuits (e.g., address decoder, sense amplifier, etc.) coupled to a SOI layer (e.g., the SOI layer 14) outside the trench 20 on a same wafer (e.g., within the same electronic structure 10).

FIG. 11 shows: shallow trench isolation (STI) 67, and STI 65, to insulatively separate the trench 20 (and electronic devices therein) from electronic devices in the SOI layer 14 outside the trench 20; STI 68 to insulatively separate the FET 90A from the FET 90B; and STI 69 to insulatively separate the FET 90B from other electronic devices coupled to the SOI layer 14 outside the trench 20. Additionally, the spacer 22 provides electrically insulative separation between the DRAM cell 50 in the trench 20 and electronic devices (e.g., the FET 90A and the FET 90B) in the SOI layer 14 outside the trench 20.

Figure 12:
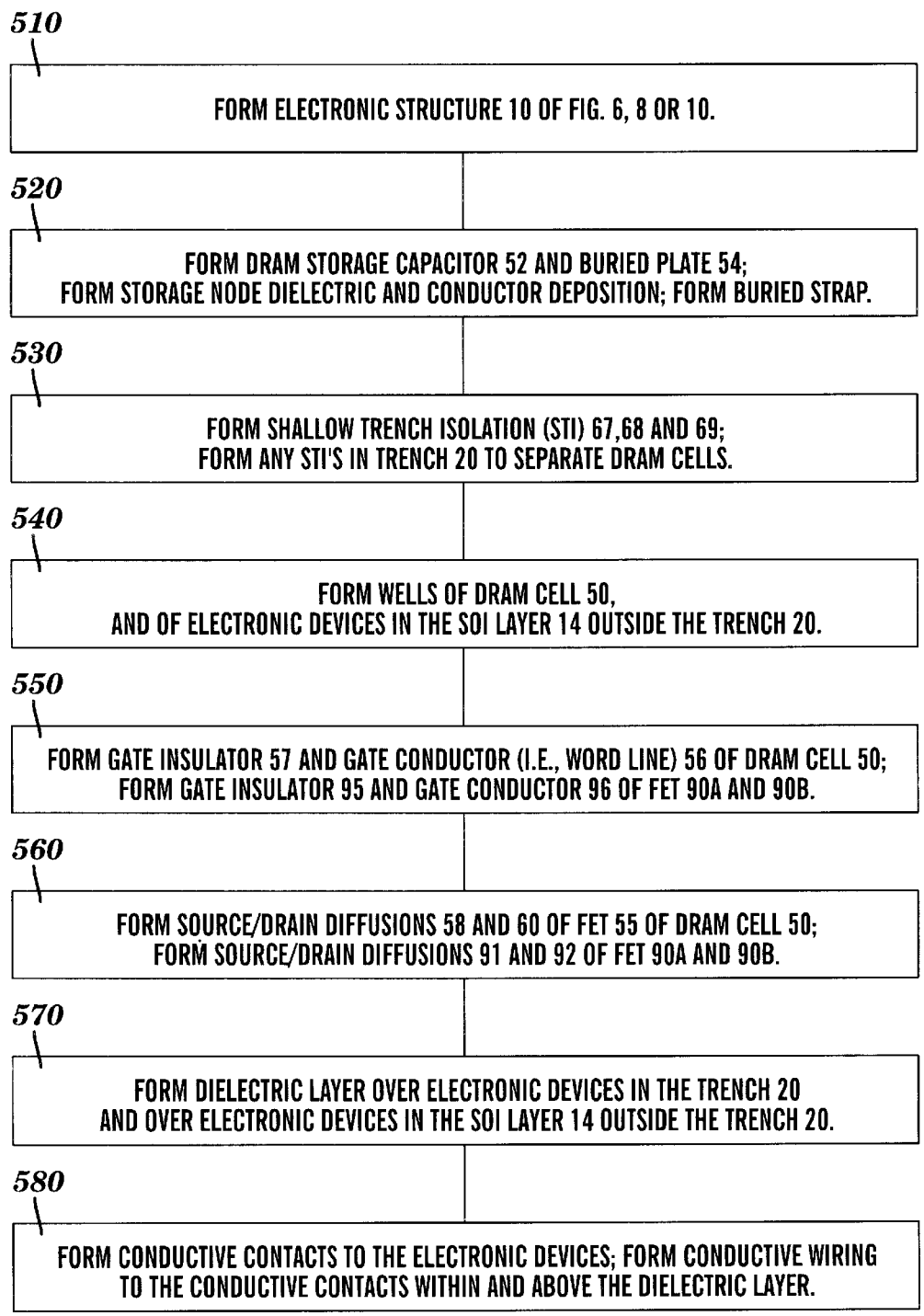
FIG. 12 depicts process steps for forming the electronic structure of FIG. 11.

FIG. 12 illustrates process steps for forming the electronic structure 10 of FIG. 11. All of the process steps, except the step 510, listed in FIG. 12 may be accomplished by any method known to a person of ordinary skill in the art. Step 510 forms the electronic structure 10 of FIG. 6, FIG. 8, or FIG. 10, having the epitaxial silicon layer 24 of FIG. 6 or FIG. 8, or the epitaxial layer 34 of FIG. 10 (in the trench 20) coexisting with the SOI layer 14. Step 520 etches a deep trench followed by forming the storage capacitor 52 in the deep trench, and forming the buried plate 54. Additionally, step 520 includes storage node dielectric and conductor deposition, and forming a buried strap. Step 530 forms the STI 67, the STI 68, and the STI 69, as well as any STI's in the trench 20. As stated supra, STI's in the trench 20 serve to separate multiple DRAM cells in the trench 20. Step 540 forms, by implantation of dopant, the P-well 62, the N-well 64, and any wells in the silicon layer 15 of the SOI layer 14 outside the trench 20. Step 550 forms the gate insulator 57 and the gate conductor (i.e., the word line) 56 in the DRAM cell 50, and the gate insulator 95 and gate conductor 96 in the silicon layer 15 of the SOI layer 14 outside the trench 20. Step 560 forms, by implantation and activation of dopant, source/drain diffusion 58 and drain/source diffusion 60 of the FET 55, and source/drain diffusion 91 and drain/source diffusion 92 of the FET 90A and FET 90B. Steps 570 and 580 further develop the electronic structure 10; structure resulting from the steps 570 and 580 are not shown in FIG. 11. Step 570 deposits a dielectric layer over the devices (DRAM and FET's) shown in FIG. 11. Step 580 forms conductive contacts with the electronic devices shown in FIG. 11 and also forms conductive wiring to the conductive contacts within and above the dielectric layer. Steps 570 and 580, in combination, generate a wiring level of the electronic structure 10. Steps 570 and 580 may be repeated for each wiring level so formed.

FIGS. 13–17 illustrate formation of bipolar transistor structures within the trench 20 of FIG. 4.

Figure 13:
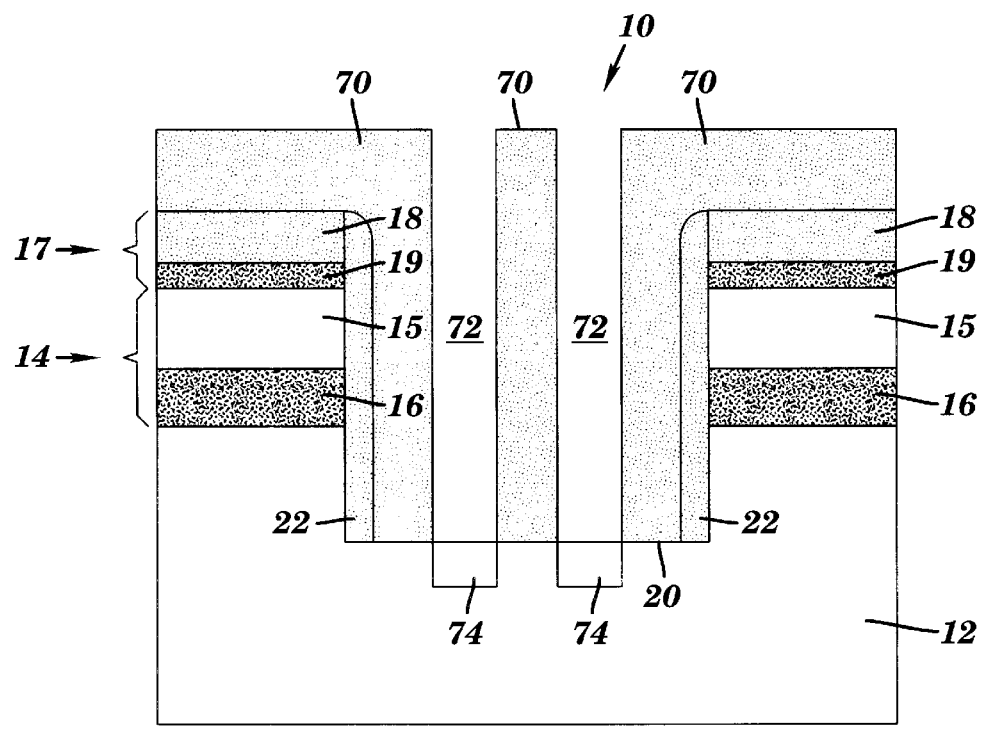
FIG. 13 depicts FIG. 4 after the trench has been masked and the bulk semiconductor substrate has been implanted with dopant to form subcollector regions below the trench.

FIG. 13 illustrates FIG. 4 after the trench 20 has been masked with photoresist 70. After exposing the photoresist 70 with ultraviolet radiation, openings 72 are formed in the photoresist 70 and the bulk semiconductor substrate 12 has been implanted (through the openings 72) with dopant to form subcollector regions 74 below the trench 20. After the subcollector regions 74 are formed, the photoresist 70 is removed by any method known to one of ordinary skill in the art.

Figure 14:
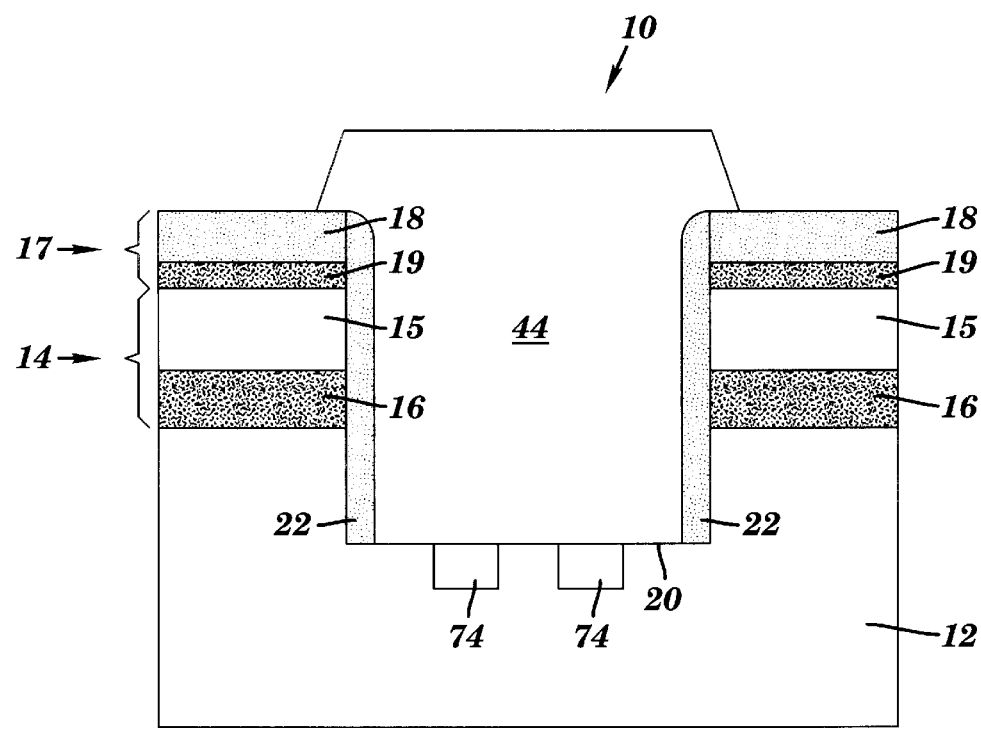
FIG. 14 depicts FIG. 13 after an epitaxial layer of single crystalline silicon or single crystalline silicon-germanium alloy has been grown or overgrown in the trench.

FIG. 14 illustrates FIG. 13 after an epitaxial layer 44 of single crystalline silicon has been grown or overgrown in the trench 20. The epitaxial layer 44 of FIG. 14 is analogous to the epitaxial layer 24 of FIG. 5. FIG. 14 is the same as FIG. 5, except that FIG. 14 additionally includes the subcollector regions 74 which are to be used in relation to bipolar transistors structures. Accordingly, all characteristics and methods of formation of the epitaxial layer 24 of FIG. 5, described supra, applies to the epitaxial layer 44 of FIG. 14. Additionally as stated supra in conjunction with FIG. 5, single crystalline silicon-germanium alloy may be grown, if desired, instead of single crystalline silicon, in the trench 20 by adding a source gas for germanium (e.g., germane $GeH_4$) in the selective silicon-germanium alloy epitaxial deposition process as is well known to one of ordinary skill in the art.

Figure 15:
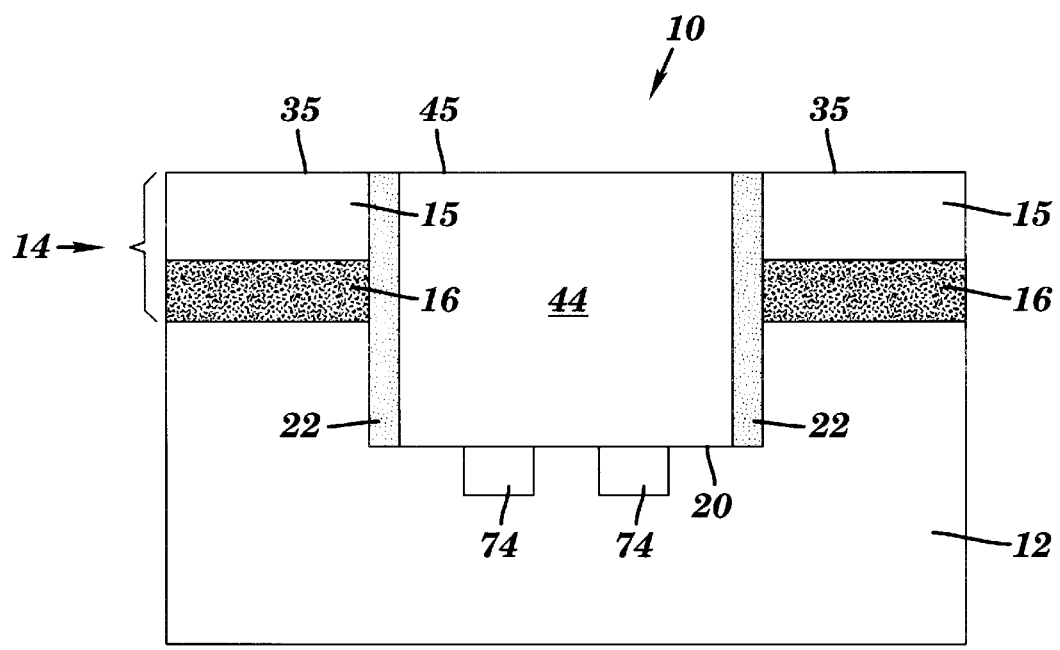
FIG. 15 depicts FIG. 14 after portions of the epitaxial layer and the pad layer have been removed, resulting in a top surface of the epitaxial layer that is about coplanar with a top surface of the SOI layer.

FIG. 15 illustrates FIG. 14 after portions of the epitaxial layer 44 and the pad layer 14 have been removed, resulting in a top surface 45 of the epitaxial layer 44 that is about coplanar with a top surface 35 of the silicon layer 15 of the SOI layer 14. FIG. 15 is the same as FIG. 6, except that FIG. 15 additionally includes the subcollector regions 74. Accordingly, the discussion supra for forming the planarized top surface 25 of the epitaxial layer 24 of FIG. 6 applies to forming the planarized top surface 45 of the epitaxial layer 44 of FIG. 15.

Alternatives were discussed supra, in relation to FIGS. 7–10, to forming the planarized epitaxial layer 24 by the method that culminated in FIG. 6. These alternatives also apply to the planarized epitaxial layer 44 of FIG. 15.

Figure 16:
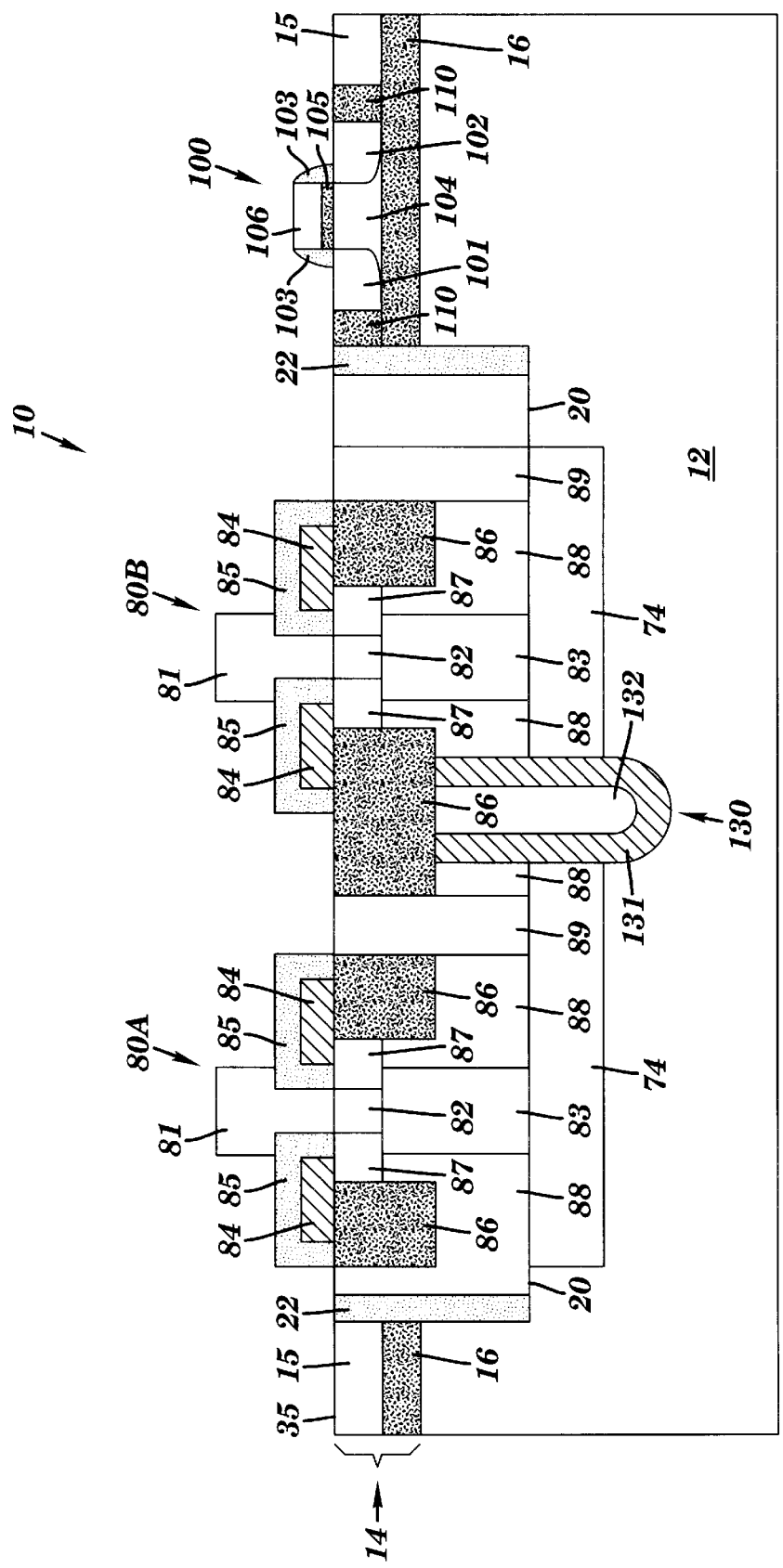
FIG. 16 depicts FIG. 15 after a first bipolar transistor structure has been formed in the epitaxial layer and a field effect transistor has been formed in the SOI layer outside the trench.

FIG. 16 illustrates FIG. 15 after a first bipolar transistor structure has been formed in the epitaxial layer 44 within the trench 20 (see FIG. 15), and a field effect transistor 100 has been formed in the SOI layer 14 outside the trench 20. The first bipolar transistor structure comprises:

a bipolar transistor 80A which includes an emitter 81, a base 82, and a collector 83; base contacts 84; insulative regions 85; base extensions 87; a well 88; a subcollector reach-through 89; and the subcollector region 74. The subcollector region 74 of the bipolar transistor 80A is coupled to the subcollector region 74. The subcollector region 74 provides an electrically conductive path between the collector 83 and the subcollector reach-through 89. If the bipolar transistor 80A is a NPN bipolar transistor, then the bipolar transistor 80A may be structured such that the emitter 81 includes a N-doped semiconductor material, the base 82 includes a P-doped semiconductor material, and the collector 83 includes a N-doped semiconductor material. Additionally, the base contact 84 would include a metal or a $P^+$ doped semiconductor material, the well 88 would include a N-well, the base extension 87 would include a $P^+$ semiconductor material, and the subcollector region 74 and the subcollector reach-through 89 would include a N+ doped semiconductor material. Alternatively, the bipolar transistor 80A could be a PNP bipolar transistor such that each of the aforementioned polarities is reversed (i.e., N-doped materials become P-doped materials, and vice versa). The bipolar transistor 80A is characterized by the base 82 not being above the top surface 35 of the silicon layer 15 of the SOI layer 14. The bipolar transistor 80A may be fabricated by any method known to one of ordinary skill in the art such as the method described in U.S. Pat. No. 5,543,653 (Grubisich 1996, hereby incorporated by reference) and in U.S. Pat. No. 5,516,718 (Lee 1996, hereby incorporated by reference).

FIG. 16 also shows a bipolar transistor 80B which is structured similar to the bipolar transistor 80A. The bipolar transistors 80A and 80B are insulatively separated by a deep trench 130 and a STI 86 above the deep trench 130. The deep trench 130 comprises an insulative liner 131 and a filler 132 (e.g., a polysilicon filler). Additional STI 86 structures are shown in the trench 20 for insulative separation purposes.

Additionally, FIG. 16 shows a FET 100 within the silicon layer 15 of the SOI layer 14. The FET 100 includes a source/drain 101, a drain/source 102, a channel 104, a gate 106, a gate insulator 105, and insulative spacers 103. The FET 100 is representative of electronic devices which may be formed in, or coupled to, the silicon layer 15 outside the trench 20. Generally, any type of electronic devices (e.g., semiconductor devices) may be formed in, or coupled to, the silicon layer 15 outside the trench 20. FIG. 16 exemplifies electronic devices (e.g., the bipolar transistors 80A and 80B) in a non-SOI epitaxial silicon enclosure (e.g., epitaxial silicon in the trench 20) coexisting with electronic devices coupled to a SOI layer (e.g., the SOI layer 14) outside the trench 20 on the same wafer (e.g., within the same electronic structure 10).

STI's 110 provide insulative separation between adjacent FET's or other electronic devices within the silicon layer 15 of the SOI layer 14 outside the trench 20. Additionally, the spacer 22 provides electrically insulative separation between the bipolar transistors 80A and 80B in the trench 20 and electronic devices (e.g., the FET 100) in the SOI layer 14 outside the trench 20.

Figure 17:
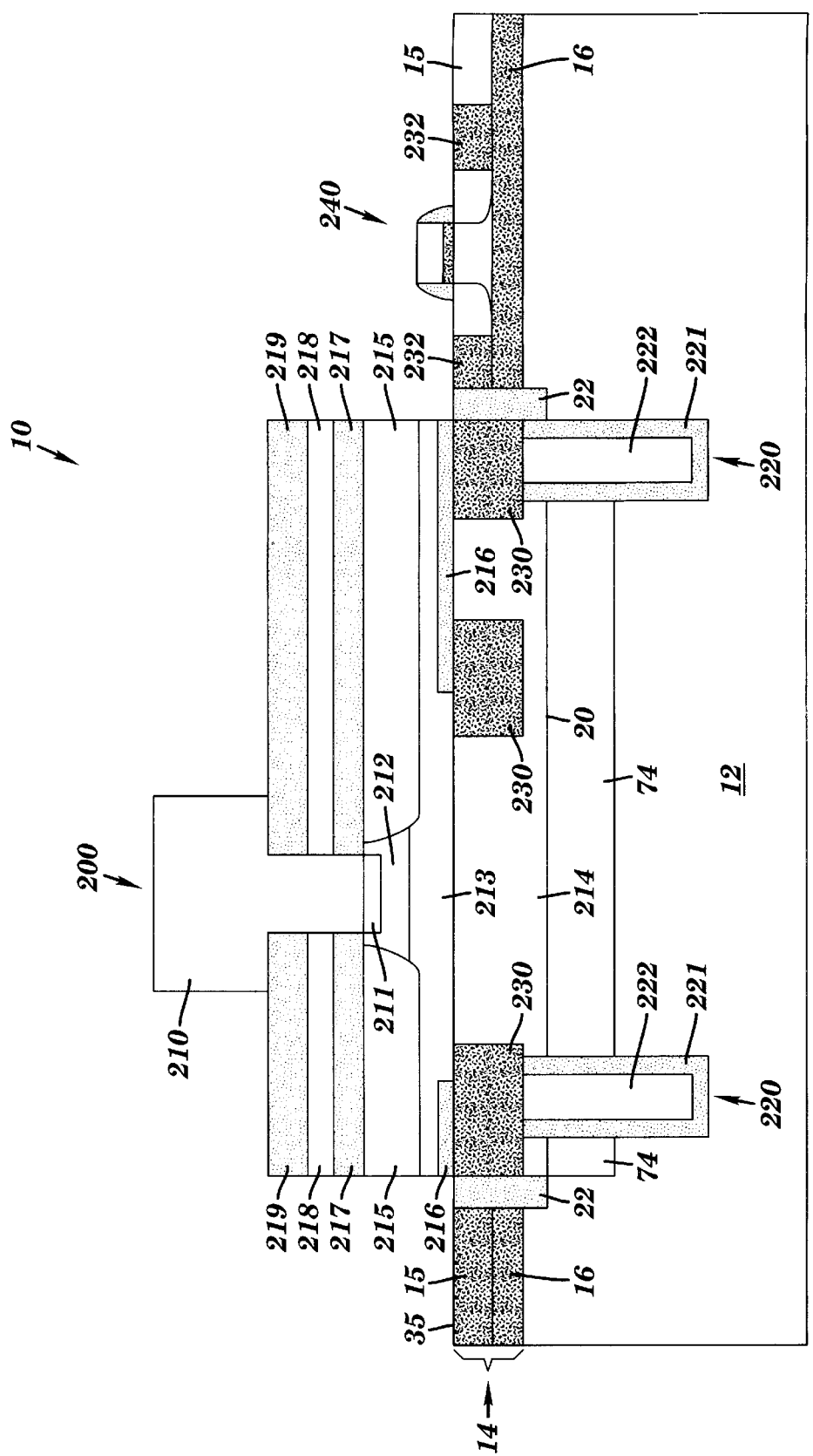
FIG. 17 depicts FIG. 15 after a second bipolar transistor structure has been formed in the epitaxial layer and a field effect transistor has been formed in the SOI layer outside the trench.

FIG. 17 illustrates FIG. 15 after a second bipolar transistor structure has been formed in the epitaxial layer 44 within the trench 20 (see FIG. 15), and a field effect transistor 240 has been formed in the SOI layer 14 outside the trench 20. The second bipolar transistor structure comprises: a bipolar transistor 200 which includes an emitter having portions 210 and 211, a base 212, and a collector having portions 213 and 214; base extensions 215; insulative regions 216, 217; 218, and 219; and the subcollector regions 74. The base 212 and base extensions 215 include silicon or a silicon-germanium alloy having a germanium atomic concentration of up to about 30%. The collector portion 214 of the bipolar transistor 200 is coupled to the subcollector region 74. The subcollector region 74 extends electrical conduction from the collector portion 214. The bipolar transistor 200 may be a NPN bipolar transistor or a PNP bipolar transistor in accordance with appropriate doping polarities (see, e.g., the description supra of FIG. 16 for a discussion of doping polarties of the first bipolar transistor structure). The bipolar transistor 200 is characterized by the base 212 being above the top surface 35 of the silicon layer 15 of the SOI layer 14. The bipolar transistor 200 may be fabricated by any method known to one of ordinary skill in the art such as the method described in U.S. Pat. No. 5,656,514 (Ahlgren et al. 1997, hereby incorporated by reference) and in U.S. Pat. No. 5,352,912 (Crabbe et al. 1994, hereby incorporated by reference).

The trench 20 may include multiple second bipolar transistor structures, and a deep trench 220 and a STI 230 above the deep trench 220 insulatively separates successive second bipolar transistor structures. The deep trench 220 comprises an insulative liner 221 and a filler 222 (e.g., a polysilicon filler). Additional STI's 230 may be present in the trench 20 for insulative separation purposes.

Additionally, FIG. 17 shows a FET 240 within the silicon layer 15 of the SOI layer 14 outside the trench 20. The FET 240 is representative of electronic devices which may be formed in, or coupled to, the silicon layer 15 outside the trench 20. Generally, any type of electronic devices (e.g., semiconductor devices) may be formed in, or coupled to, the silicon layer 15 outside the trench 20. FIG. 16 exemplifies electronic devices (e.g., the bipolar transistor 200) in a non-SOI epitaxial silicon enclosure (e.g., epitaxial silicon in the trench 20) coexisting with electronic devices coupled to a SOI layer (e.g., the SOI layer 14) outside the trench 20 on the same wafer (e.g., within the same electronic structure 10).

STI's 232 provide insulative separation between adjacent FET's or other electronic devices within the silicon layer 15 of the SOI layer 14 outside the trench 20. Additionally, the spacer 22 provides electrically insulative separation between the bipolar transistor 200 in the trench 20 and electronic devices (e.g., the FET 240) in the SOI layer 14 outside the trench 20.

While FIG. 11 depicts a DRAM cell in the trench 20, and FIGS. 16 and 17 depict bipolar transistors in the trench 20, other electronic devices may be formed within the trench 20. For example, Complementary Metal Oxide Semiconductor (CMOS) circuits which are sensitive to floating body effects, such as dynamic logic circuits, may be formed in the trench 20. As another example, devices requiring threshold voltage matching, such as static random access memory (SRAM) devices, may be formed in the trench 20.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:

a silicon-on-insulator (SOI) structure having a buried oxide layer (BOX) on a bulk silicon substrate, and a silicon layer on the BOX;

a trench through the silicon layer, through the BOX, and through a depth D of the silicon substrate, wherein D>0;

insulative spacers on the sidewall surfaces of the trench; and an epitaxial layer of silicon or silicon-germanium alloy in the trench from a bottom surface of the trench to a height at or above a top surface of the silicon layer, wherein the insulative spacers provide electrical insulation between the silicon layer outside the trench and the epitaxial layer; and wherein the epitaxial layer includes a single-crystalline silicon or silicon-germium alloy region within an interior portion of the trench and a polycrystalline silicon or silicon-germanium alloy region abutting the trench sidewall surfaces, wherein the polycrystalline silicon or silicon-germanium alloy region is disposed between the trench sidewall surfaces and the single-crystalline silicon or silicon germanium alloy region.

2. The electronic structure of claim 1, further comprising an electronic device within the trench.

3. The electronic structure of claim 2, wherein the electronic device includes a Dynamic Random Access Memory (DRAM) cell.

4. The electronic structure of claim 3, further comprising a field effect transistor coupled to the SOI structure outside the trench.

5. The electronic structure of claim 2, wherein the electronic device includes a Complementary Metal Oxide Semiconductor (CMOS) circuit which is sensitive to floating body effects.

6. The electronic structure of claim 2, wherein the electronic device requires threshold voltage matching.

7. The electronic structure of claim 2, wherein D>0, and wherein the electronic device includes a bipolar transistor.

8. The electronic structure of claim 7, wherein the epitaxial layer includes a collector of the bipolar transistor on and extending from the bottom surface of the trench and further wherein the bulk silicon substrate comprises a subscollector region below the trench, wherein the collector of the bipolar transistor contacts and is electrically coupled to the subcollector region.

9. The electronic structure of claim 7, wherein a base of the bipolar transistor is not above a top surface of the silicon layer.

10. The electronic structure of claim 7, wherein a base of the bipolar transistor is above a top surface of the silicon layer.

11. The electric structure of claim 1, further comprising a semiconductor device coupled to the SOI structure outside trench.

12. The electronic structure of claim 11, wherein the semiconductor device includes a field effect transistor.

13. The electronic structure of claim 1, further comprising;

an electronic device within the trench; and wherein the electronic device includes a bipolar transistor; and wherein a base of the bipolar transistor is above a top surface of the silicon layer.

* * * * *